US010770155B2

(12) United States Patent
Fisher et al.

(10) Patent No.: US 10,770,155 B2
(45) Date of Patent: Sep. 8, 2020

(54) DETERMINING A READ APPARENT VOLTAGE INFECTOR PAGE AND INFECTED PAGE

(71) Applicant: INTERNATIONAL BUSINESS MACHINES CORPORATION, Armonk, NY (US)

(72) Inventors: Timothy Fisher, Cypress, TX (US); Aaron D. Fry, Richmond, TX (US); Van Huynh, Houston, TX (US); Charles A. Keller, Houston, TX (US); Jason Szecheong Ma, Sugar Land, TX (US); Kevin E. Sallese, Fushear, TX (US); Adalberto G. Yanes, Sugar Land, TX (US)

(73) Assignee: International Business Machines Corporation, Armonk, NY (US)

( * ) Notice: Subject to any disclaimer, the term of this patent is extended or adjusted under 35 U.S.C. 154(b) by 55 days.

(21) Appl. No.: 16/157,597

(22) Filed: Oct. 11, 2018

(65) Prior Publication Data
US 2020/0117371 A1   Apr. 16, 2020

(51) Int. Cl.
*G11C 16/34* (2006.01)
*G06F 3/06* (2006.01)
(Continued)

(52) U.S. Cl.
CPC .......... *G11C 16/3427* (2013.01); *G06F 3/064* (2013.01); *G06F 3/0619* (2013.01);
(Continued)

(58) Field of Classification Search
None
See application file for complete search history.

(56) References Cited

U.S. PATENT DOCUMENTS 9,099,184 B2   8/2015   Seol et al.
9,142,309 B2   9/2015   Bellorado et al.
(Continued)

FOREIGN PATENT DOCUMENTS

WO   2010002941 A1   1/2010

OTHER PUBLICATIONS

Cai, et al., "Program Interference in MLC NAND Flash Memory—Characterization, Modeling, and Mitigation", Oct. 21, 2013.
(Continued)

*Primary Examiner* — Steve N Nguyen
(74) *Attorney, Agent, or Firm* — Zip Group PLLC

(57) ABSTRACT

Read Apparent Voltage (RAV) is an anomaly in which an apparent threshold voltage of a storage cell transistor does not equal the actual threshold voltage of that same transistor by a large enough magnitude that the binary state of transistor is not read correctly. An infector page may cause the RAV anomaly within a different infected page. To determine whether any page is an infector, each page is programmed, a page within each block is read, an acting infector page within an acting infector block is set, a possible infected page within a possible infected block is set, the acting infector page is read a predetermined plurality of instances, the possible infected page is read, a raw bit error rate (RBER) of the read of the possible infected page is determined, and the acting infector page is set as an actual infector page based upon the determined RBER.

20 Claims, 5 Drawing Sheets

(51) Int. Cl.
*G06F 11/10* (2006.01)
*G11C 16/26* (2006.01)
(52) U.S. Cl.
CPC ........ *G06F 3/0679* (2013.01); *G06F 11/1012* (2013.01); *G11C 16/26* (2013.01); *G11C 16/3404* (2013.01)

(56) References Cited

U.S. PATENT DOCUMENTS

| | | | |
|---|---|---|---|
| 9,171,620 B2* | 10/2015 | Avila | G06F 11/106 |
| 9,378,090 B2 | 6/2016 | Cai et al. | |
| 9,508,426 B2 | 11/2016 | Bedeschi | |
| 9,760,307 B2 | 9/2017 | Avila et al. | |
| 9,836,351 B2 | 12/2017 | Maffeis | |
| 2006/0221692 A1* | 10/2006 | Chen | G11C 11/5642 |
| | | | 365/185.11 |
| 2007/0047327 A1* | 3/2007 | Goda | G11C 8/08 |
| | | | 365/185.29 |
| 2011/0141808 A1* | 6/2011 | Haratsch | G11C 11/5628 |
| | | | 365/185.03 |
| 2013/0094293 A1* | 4/2013 | Seol | G11C 16/26 |
| | | | 365/185.03 |
| 2014/0313822 A1* | 10/2014 | Zeng | G11C 16/3427 |
| | | | 365/185.02 |
| 2015/0194219 A1* | 7/2015 | Asadi | G11C 16/3422 |
| | | | 702/65 |
| 2016/0225461 A1* | 8/2016 | Tuers | G11C 16/3427 |
| 2018/0190362 A1* | 7/2018 | Barndt | G11C 16/3431 |

OTHER PUBLICATIONS

Cai, et al., "Neighbor-Cell Assisted Error Correction for MLC NAND Flash Memories," SIGMETRICS'14, Jun. 16-20, 2014, Austin, TX, USA.

* cited by examiner

202  Die
204  Plane
206  Block
208  Page

DETERMINING A READ APPARENT VOLTAGE INFECTOR PAGE AND INFECTED PAGE

FIELD OF THE INVENTION

Embodiments of the invention generally relate to computers and more particularly to determining whether an infector page within a first block causes read apparent voltage anomalies in infected page(s) within different blocks.

DESCRIPTION OF THE RELATED ART

Read Apparent Voltage (RAV) is an anomaly in which an apparent threshold voltage of a storage cell transistor does not equal the actual threshold voltage of that same transistor by a large enough magnitude that the binary state of transistor is not read correctly. Such an anomaly may persist even when data protection and/or error correction code schemes are utilized.

SUMMARY

In an embodiment of the present invention, a method for determining a read apparent voltage infector and infected page is presented. The method includes programming each page of each block within a plane, reading one or more pages within each block within the plane, setting an acting infector page within an acting infector block within the plane, setting a possible infected page within a possible infected block within the plane, reading the acting infector page a predetermined plurality of instances, subsequently reading the possible infected page, determining a raw bit error rate (RBER) of the read of the possible infected page, and setting the acting infector page as an actual infector page and setting the possible infected page as an actual infected page based upon the determined RBER.

In another embodiment of the present invention, a computer program product for determining a read apparent voltage infector and infected page is presented. The computer program product includes a computer readable storage medium having program instructions embodied therewith. The program instructions readable by a processor to cause the processor to program each page of each block within a plane, read one or more pages within each block within the plane, set an acting infector page within an acting infector block within the plane, set a possible infected page within a possible infected block within the plane, read the acting infector page a predetermined plurality of instances, subsequently read the possible infected page, determine a raw bit error rate (RBER) of the read of the possible infected page, and set the acting infector page as an actual infector page and setting the possible infected page as an actual infected page based upon the determined RBER.

In yet another embodiment of the present invention, a computer that includes a processor and a memory is presented. The memory includes program instructions that are readable by the processor to cause the processor to program each page of each block within a plane, read one or more pages within each block within the plane, set an acting infector page within an acting infector block within the plane, set a possible infected page within a possible infected block within the plane, read the acting infector page a predetermined plurality of instances, subsequently read the possible infected page, determine a raw bit error rate (RBER) of the read of the possible infected page, and set the acting infector page as an actual infector page and setting the possible infected page as an actual infected page based upon the determined RBER.

These and other embodiments, features, aspects, and advantages will become better understood with reference to the following description, appended claims, and accompanying drawings.

It is to be noted, however, that the appended drawings illustrate only example embodiments of the invention and are therefore not considered a limitation of the scope of embodiments of the invention.

DETAILED DESCRIPTION

Read Apparent Voltage (RAV) is an anomaly in which an apparent threshold voltage of a storage cell transistor does not equal the actual threshold voltage of that same transistor by a large enough magnitude that the binary state of transistor is not read correctly. An infector page may cause the RAV anomaly within a different infected page. To determine whether any page is an infector, each page is programmed, a page within each block is read, an acting infector page within an acting infector block is set, a possible infected page within a possible infected block is set, the acting infector page is read a predetermined plurality of instances, the possible infected page is read, a raw bit error rate (RBER) of the read of the possible infected page is determined, and the acting infector page is set as an actual infector page based upon the determined RBER.

Figure 1:
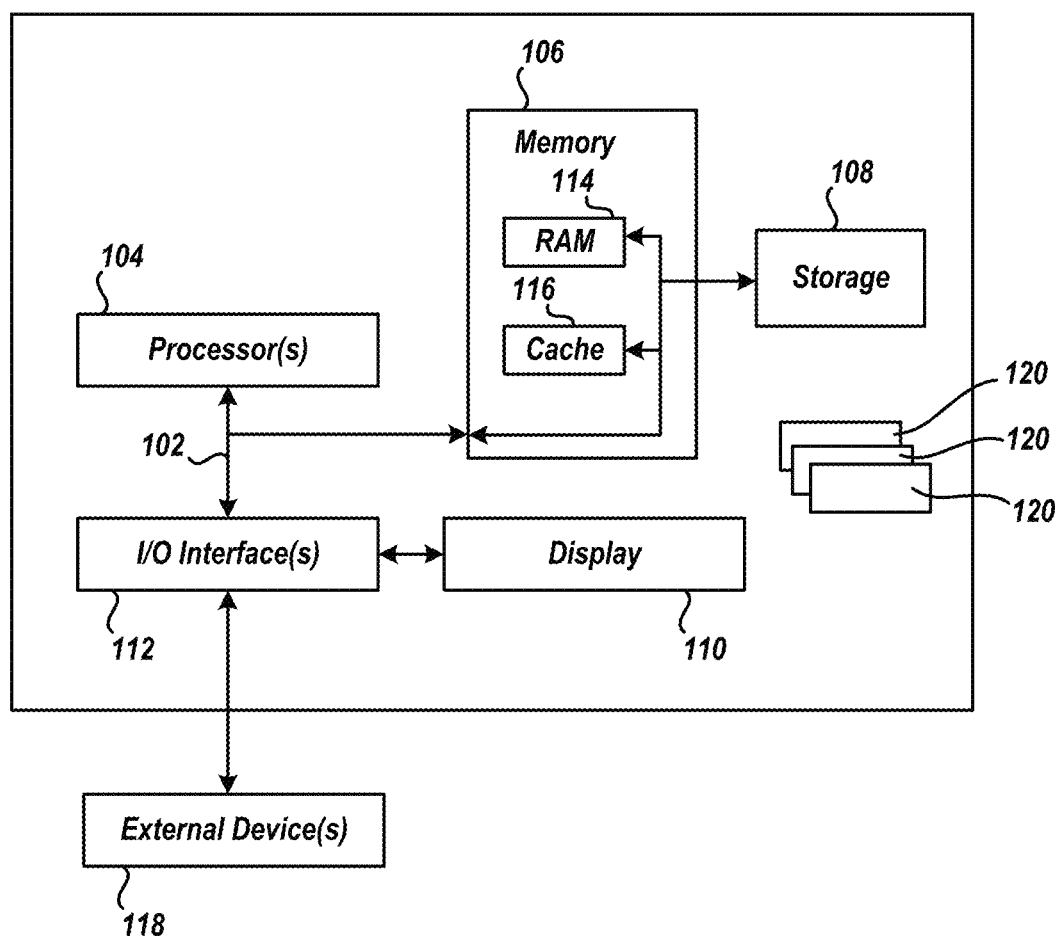
FIG. 1 illustrates a high-level block diagram of an exemplary computer for implementing various embodiments of the invention.

Referring to the Drawings, wherein like numbers denote like parts throughout the several views, FIG. 1 depicts a high-level block diagram representation of a computer 100. It should be appreciated that FIG. 1 provides only an illustration of one device to implement one or more embodiments of the present invention and does not imply any limitations with regard to the types of systems in which different embodiments may be implemented.

Computer 100 includes communications bus 102, which provides communications between processor(s) 104, memory 406, storage 108, and input/output (I/O) interface(s) 112.

The memory 106 may comprise a random-access memory 114, cache memory 416, or any other suitable non-volatile or volatile storage device. In another embodiment, the memory 106 represents the entire virtual memory of the computer 100 and may also include the memory of other computers communicatively coupled to the computer 100. The memory 106 may be a single monolithic entity, but in other embodiments the memory 106 may have a more complex arrangement, such as a hierarchy of caches 116 and/or other memory devices. For example, memory 102 may exist in multiple levels of caches 116, and these caches 116 may be further divided by function, so that one cache holds instructions while another holds non-instruction data, which is used by the processor 104. Memory 106 may be further distributed and associated with different processors 101 or sets of processors 101, as is known in any of various so-called non-uniform memory access (NUMA) computer architectures.

The memory 102 may store or encodes an operating system 120 and one or more applications 130. Although the operating system 120 applications 130 are illustrated as being contained within the computer 100, in other embodiments all or the operating system 120, applications 130 or a portion thereof may be on a different computer and may be accessed remotely, by e.g., a network. The computer 100 may use virtual addressing mechanisms that allow the programs of the computer 100 to behave as if they only have access to a large, single storage entity instead of access to multiple, smaller storage entities. Thus, while operating system 120, applications 130, or other program instructions may be contained within the memory 106, these elements are not necessarily all completely contained in the same storage device at the same time. Further, although operating system 120, applications 130, are illustrated as being separate entities, in other embodiments some of them, portions of some of them, or all of them may be packaged together, etc.

In an embodiment, operating system 120, applications 130 comprise instructions or statements that execute on the one or more processors 104 and/or instructions or statements that are interpreted by instructions or statements that execute on the one or more processors 104 to carry out the functions as further described below. When such program instructions are called or evoked by the one or more processors 104, such computer 100 or system or multiple computers become a particular machine configured to carry out such instructions.

Storage 108 may be disk drive storage device(s), solid-state storage device(s), or the like. In embodiments multiple storage devices are configured to appear as a single large storage device. The contents of the system memory 106, or any portion thereof, may be stored to and retrieved from the storage 108, as needed. The storage 108 generally has a slower access time than does the memory 106, meaning that the time needed to read and/or write data from/to the memory 106 is less than the time needed to read and/or write data from/to for the storage 108. In a particular embodiment, storage 108 includes one or more flash solid-state storage devices.

I/O interface(s) 112 provides for communications with other devices, such as one or more external devices 118: e.g., data processing systems, storage systems, or the like, or such as one or more internal devices, such as display 110. I/O interface(s) 112 may include one or more network interface cards. I/O interface(s) 112 may provide communications through the use of either or both physical and wireless communications links. For example, I/O interface 112 may provide a connection to external devices 118, such as a different computer, server, camera, mouse, keyboard, keypad, touch screen, and/or some other suitable input or output device. The different computer that which may be connected to via the I/O interface 112 may have similar components to computer 100. For example, a second computer may include flash solid state storage devices within its storage. Computer 100 may write to and read from such remote flash solid state storage devices in this different computer, as is known in the art.

Display 110 provides a mechanism to display data, such as a graphical user interface, to a user and may be, for example, a computer monitor, touch screen, or the like. Display 102 may be integral to computer 100 and may also function as a touch screen or may be an external device 118.

FIG. 1 is intended to depict the representative major components of the computer 100. The individual components may have greater complexity than represented in FIG. 1, components other than or in addition to those shown in FIG. 1 may be present, and the number, type, and configuration of such components may vary. Several particular examples of such additional complexity or additional variations are disclosed herein; these are by way of example only and are not necessarily the only such variations. The various program instructions implementing e.g. upon computer 100 according to various embodiments of the invention may be implemented in a number of manners, including using various computer applications, routines, components, programs, objects, modules, data structures, etc.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Embodiments of the present invention may also be delivered as part of a service engagement with a client corporation, nonprofit organization, government entity, internal organizational structure, or the like. Aspects of these embodiments may include configuring a computer system to perform, and deploying software, hardware, and web services that implement, some or all of the methods described herein. Aspects of these embodiments may also include analyzing the client's operations, creating recommendations responsive to the analysis, building systems that implement portions of the recommendations, integrating the systems into existing processes and infrastructure, metering use of the systems, allocating expenses to users of the systems, and billing for use of the systems. Although the above embodiments of present invention each have been described by stating their individual advantages, respectively, present invention is not limited to a particular combination thereof. To the contrary, such embodiments may also be combined in any way and number according to the intended deployment of present invention without losing their beneficial effects.

Figure 2:
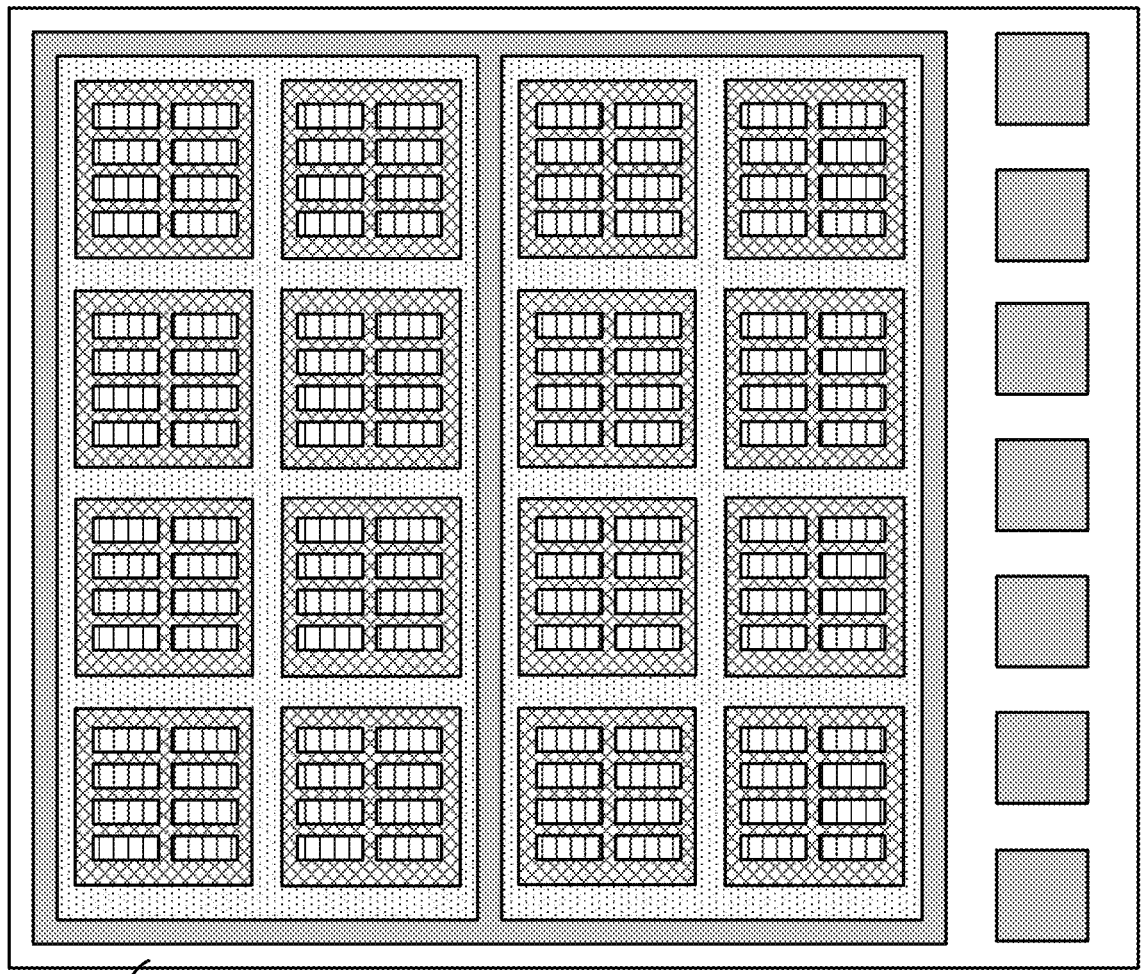
FIG. 2 illustrates a high-level block diagram of a storage device that includes blocks and pages and that may implement various embodiments of the invention.
Figure 2:
Figure 2:
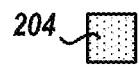
Figure 2:
Figure 2:
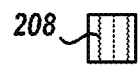

FIG. 2 illustrates a high-level block diagram of a storage device 200 within storage 108 that includes blocks 206 and pages 208 and that may implement various embodiments of the invention. Storage device 200 may be a solid-state storage device, such as a NAND flash storage device. For clarity, storage 108 may include one or more storage devices 200.

Figure 3A:
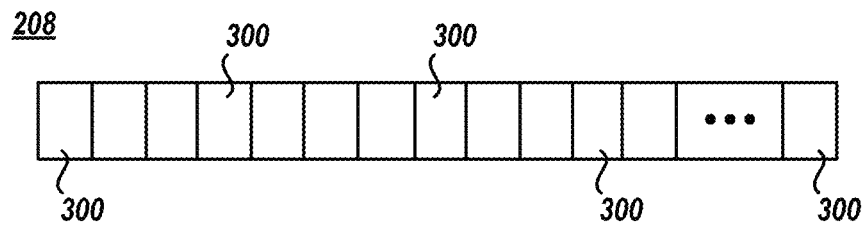
FIG. 3A illustrates an exemplary page that includes multiple storage cells, according to one or more embodiments of the present invention.

Storage device 200 may be integrated into a package that may be electrically connected to a circuit board, module, or the like, of storage 108, as is known in the art. Storage device 200 may include one or more dies 202. Each die 202 may include one or more planes 204. Each plane 204 may include one or more blocks 206. A block 206 is generally the smallest unit that can be erased. Each block 206 includes a number of pages 208. A page 208 is generally the smallest unit that can be written to or than can be read. As is shown in FIG. 3A, each page 208 includes multiple storage cells 300.

Figure 3B:
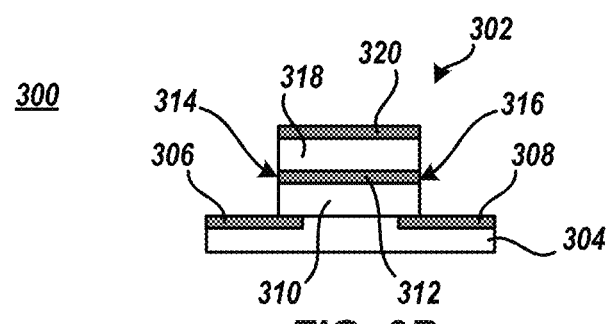
FIG. 3B illustrates an exemplary storage cell transistor, according to one or more embodiments of the present invention.

FIG. 3B illustrates an exemplary storage cell transistor 302. One or more transistors 302 may be integrated into each storage cell 300. The cell 300 can be set to either a 0 or 1 state and may continue to store that state even after power has been removed therefrom.

Transistor 302 may be a floating gate transistor. Electrical charge may be stored on a floating gate 312 which is isolated above by dielectric layer(s) 318 and which is isolated below by dielectric layer(s) 310.

When the floating gate 312 is charged, it is programmed and is theoretically stores and is recognized in the binary state of 0. When the floating gate 312 has no charge, it is erased and theoretically stores and recognized in the binary state of 1.

To program transistor 302, a write voltage is applied to control gate 320 and electrons tunnel through the dielectric layer(s) 310 from a semiconductor substrate 304 to the floating gate 312 and are stored within floating gate 312 as electrical charge.

To read from transistor 302, a read voltage may be applied to the control gate 320 and current flow from source 306 to drain 308 is attempted. Theoretically, if there is no current flow from source 306 to drain 308 through a channel below the floating gate 312, it signifies the floating gate 312 is charged (i.e. in binary state 0) and transistor 302 is off. Likewise, if there is current flow from source 306 to drain 308 through the channel within substrate 304, it signifies the floating gate 312 is not charged (i.e. in binary state 1) and transistor 302 is on. In other words, conduction represents when transistor 302 is on: current flows across the channel between the source 306 and drain 308 and non-conduction represents when transistor 302 is off: when current does not flow across the channel between the source 306 and drain 308. As is known in the art, there are other means of reading transistor 302 in addition to applying a particular voltage to the control gate 320 and determining whether the transistor 302 turns on or off.

Typically, transistor 302 will conduct if the voltage being applied to the control gate 320 is greater than the threshold voltage of the transistor 302 and the transistor 302 will not conduct if the voltage applied to the control gate 320 is less than the threshold voltage. The threshold voltage of the transistor 302 is theoretically dictated by the amount of charge that is retained on the floating gate 312. That is, the threshold voltage of the transistor 302 is the minimum amount of voltage that must be applied to the control gate 320 before the transistor 302 is turned on to permit conduction between source 306 and drain 308 and is controlled by the level of charge on the floating gate 312.

Read Apparent Voltage (RAV) is an anomaly in which an apparent threshold voltage of transistor 302 does not equal the threshold voltage of that same transistor 302 by a large enough magnitude that the binary state of transistor 302 is not read correctly. That is, the apparent threshold voltage of transistor 302 does not accurately reflect the level of charge on the floating gate 312. This, in turn, can cause an incorrect determining of what data was stored in the cell (i.e., whether the transistor 302 stores the binary state of 0 or 1) even when data protection and/or error correction code schemes are utilized.

For example, the threshold voltage of transistor 302 is actually X volts. However, the threshold voltage of transistor 302 may appear to be X+2 volts (i.e., the apparent threshold voltage). If X+1 volts are applied to control gate 320, transistor 302 is on (i.e., the applied X+1 voltage is greater than the threshold voltage of X volts) and the transistor 302 stores the binary state of 1. However, because the applied X+1 voltage is less than the apparent threshold voltage X+2, transistor 302 appears to be off and to store the binary state of 0.

Similarly, the threshold voltage of transistor 302 may appear to be X-2 volts (i.e., the apparent threshold voltage). If X-1 volts are applied to control gate 320, transistor 302 is off (i.e., the applied X-1 voltage is less than the threshold voltage of X volts) and the transistor 302 stores the binary state of 0. However, because the applied X-1 voltage is greater than the apparent threshold voltage X-2, transistor 302 appears to be on to store the binary state of 1.

With regard to the RAV anomaly, the transistor 302 has two states that represent the best and worst case scenarios, respectively, for accurately reading data stored therein. The "Negative" state is a state in which the apparent threshold voltage of the transistor does not equal the threshold voltage of that same transistor 302 by a large enough magnitude that the binary state of transistor 302 is not able to be accurately read. The "Positive" state is the state in which the apparent threshold voltage of transistor 302 is equal to actual threshold voltage of the transistor, which results in the highest probability of accurately reading the binary state of transistor 302.

The RAV anomaly increases the raw bit error rate (RBER) within a read block when any page in the read block is in the Negative state. Transistors 302 may fluctuate amongst the Negative, Positive, or a state between the Negative and Positive states, herein referred to as the Between state. The state of transistor 302: Positive, Negative, or Between, may depend upon to position of transistor 302 amongst the other transistors within same plane 204, upon the number of read/copy/erase cycles transistor 302 has been subject to, upon the elapsed time in which the transistor has been in operation, upon the temperature in which the transistor 302 operates, and/or the like.

Initially, known Program Verify operations during transistor 302 programming ensure that each programmed transistor 302 is in the Positive state. Over time, transistor 302 drifts towards the Negative state where a proportional increase in RBER may be experienced. Once in the Negative state, the RAP anomaly may result in the inaccurate reading of the binary state of transistor 302. The time it takes for transistor 302 to transition from the Positive state to the Negative state varies and can be accelerated by increased temperature and other transistor 302 operations, such read operations, copy/move/erase cycles, etc. The rate of acceleration may correspond, in part, to the number and type of operations and the placement of such operations, in time, relative to the natural time-based shift to from the Positive to the Negative state. For example, each copy/move/erase cycle may incrementally accelerate the pace of the transition of affected transistors 302 towards the Negative state.

A read of a page 208 in a given block 206 transitions all transistors 302 within that block 206, whether respectively in the Positive or Negative State, to the Positive state.

With certain workloads, some pages 208 or blocks 206 within a given die 202 can be read relatively quickly, over and over again, while other pages 208 or blocks 206 within the same die 202 are read relatively slowly, periodically, and/or with much greater elapsed time between successive reads.

Some pages 208 or blocks 206 within a die 202 showcase an infector/infected relationship whereby reads from transistors 302 within an infector block 206 or page 208 adversely accelerates the time for the transistors 302 in an infected block 206 or page 208 to enter the Negative state. For example, though repeatedly or sequentially reading a first page 208 in a first block 206 keeps all transistors 302 in the first page 208 in the Positive state, it adversely affects the transistors 302 of a second page 208 in a second block 206 by accelerates the time for the transistors 302 in the second page 208 to enter the Negative state.

Figure 4A:
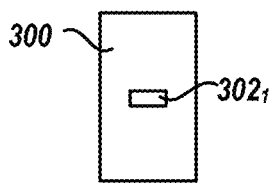
FIG. 4A illustrates an exemplary storage cell that stores one bit, according to one or more embodiments of the present invention.

FIG. 4A illustrates an exemplary storage cell 300 that includes one transistor 302. The depicted storage cell 300 may be configured as a single-level cell (SLC) and stores one bit per cell 300 and two levels of charge (i.e, binary state 0 or 1). The SLC may be a planar or two dimensional NAND flash single layer cell, as is known in the art.

Figure 4B:
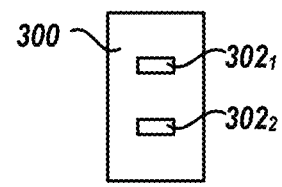
FIG. 4B illustrates an exemplary storage cell that stores two bits, according to one or more embodiments of the present invention.

FIG. 4B illustrates an exemplary storage cell 300 that includes two transistors 302. The depicted storage cell 300 may be configured as a multi-level cell (MLC) and stores two total bits per cell 300, one bit per transistor 302, and four levels of charge (i.e. binary states of the combined transistors 302 of 00, 01, 10, or 11). The MLC may be a planar or two dimensional NAND flash cell, as is known in the art. The MLC may be a three dimensional NAND flash cell, as is known in the art.

Figure 4C:
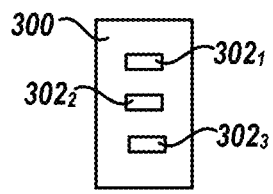
FIG. 4C illustrates an exemplary storage cell that stores three bits, according to one or more embodiments of the present invention.
Figure 4D:
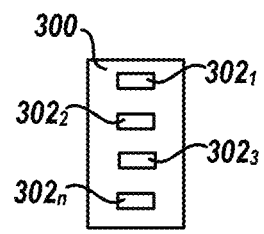
FIG. 4D illustrates an exemplary storage cell that stores n bits, according to one or more embodiments of the present invention.

FIG. 4C illustrates an exemplary storage cell that includes three transistors 302. The depicted storage cell 300 may be configured as a triple-level cell (TLC) and stores three total bits per cell 300, one bit per transistor 302, and eight levels of charge (i.e. binary states of the combined transistors 302 of 000, 001, 010, 011, 100, 101, 110 or 111). The TLC may be a planar or two dimensional NAND flash cell, as is known in the art. The TLC may be a three dimensional NAND flash cell, as is known in the art.

FIG. 4C illustrates an exemplary storage cell that includes four transistors 302. The depicted storage cell 300 may be configured as a quadruple-level cell (QLC) and stores four total bits per cell 300, one bit per transistor 302, and sixteen levels of charge. The QLC may be a three dimensional NAND flash cell, as is known in the art.

Though shown as including one to four transistors 302 in FIG. 4A through FIG. 4D, storage cell 300 may include additional transistors 302, or the like, as is known or later developed in the art.

Figure 5:
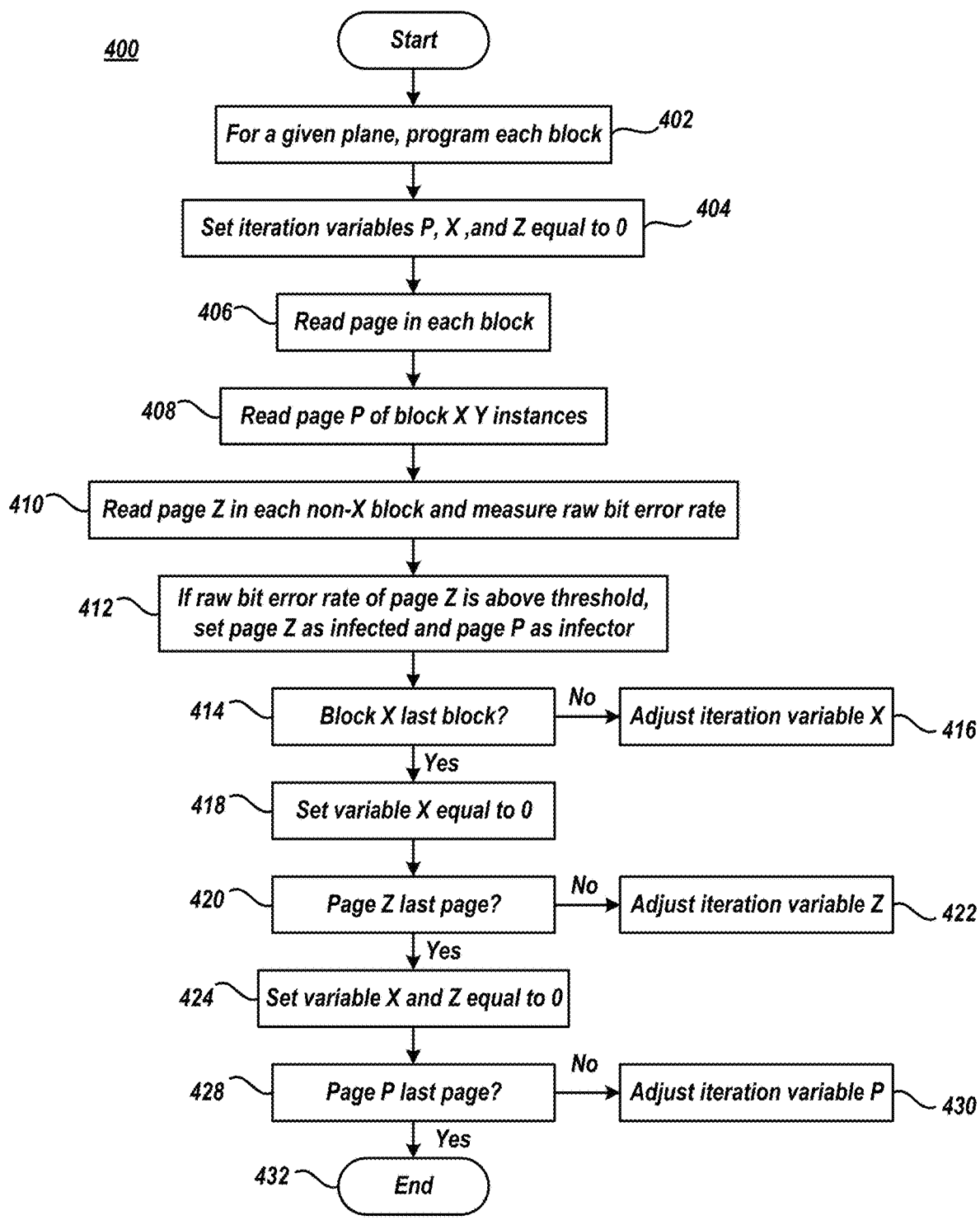
FIG. 5 illustrates an exemplary method for determining read apparent voltage infector page and infected page relationships, according to one or more embodiments of the present invention.

FIG. 5 illustrates an exemplary method 400 for determining RAD infector and infected relationship(s) between pages 208 within a plane 204, according to one or more embodiments of the present invention.

Method 400 may be embodied within program instructions of operating system 120 and/or one or more applications 130, that are stored in memory 106. When processor(s) 104 evokes such program instructions, the processor(s) 104 become a particular machine configured to carry out such instructions.

Generally, method 400 identifies one page 208 as an acting infector page in a block 206 within the plane 204, reads the acting infector page a predetermined number of instances, reads a corresponding page 208 in the other blocks 206 within the plane 204 to determine whether the RBER of the data read from the corresponding pages 208 is above a predetermined threshold, and indicates an actual infector/infected relationship between the acting infector page 208 and applicable corresponding pages 208 if their determined RBER is above the predetermined threshold. Method 400 may be generally iteratively performed until each page 208 within plane 204 has been the acting infector page and it has been determined whether the acting infector page is actually an infector page to other corresponding pages 208 in the other blocks 206.

Method 400 begins at block 402 and continues with programming each block 206 within a plane 204 (element 402). In other words, each transistor 302 within each storage cell 300 within each page 208 within each block 206 within the plane 204 is programmed. That is, each floating gate 312 is charged within each transistor 302 of each block 206 in the plane 204. Therefore, each transistor 302 is off and stores the binary state 0.

Method 400 may continue with setting an infector block iteration variable X equal to zero, an infector page variable P equal to zero, and a potential infected page variable Z equal to zero (element 404).

Method 400 may continue with reading a page 208 in each block 206 (element 406).

Method 400 may continue with reading page P of block X a number Y instances (element 408). Method 400 may continue with reading page Z in each block 206—other than block X—and measuring the RBER of the data read from page Z (element 410).

Method 400 may continue with setting or indicating that page P infects page Z if the RBER of the data read from page Z is above a predetermined RBER threshold (element 412). In other words, if the RBER of the data read from page Z is above the RBER threshold, there is an infector/infected relationship between page P and page Z. More specifically, it is indicated that Page P is an infector of Page Z. If there is a determined infector/infected relationship between page P and page Z, a page 208 in the same block as page Z may be read to ensure all of pages 208 in the same block as page Z are in the Positive state upon a triggering predetermined number of reads of page Z.

Method 400 may continue with determining whether block X is the last block within the plane 204 to be treated as the aggressor block (element 414). If block X is not the last block within plane 204 to be treated as the aggressor block, the aggressor block iteration variable X is adjusted: incremented, wrapped, or the like to identify a next block within plane 204 that has not been treated as the aggressor block (element 416) and method 400 returns to element 406. If block X is the last block within plane 204 to be treated as the aggressor block, the aggressor block iteration variable X is set to zero (element 418).

Method 400 may continue with determining whether page Z is the last page within each block X to be considered as a potential infected block (element 420). If page Z is not the last page within each block X to be considered a potential infected page, the potential infected page variable Z is adjusted: incremented, wrapped, or the like to identify a next page within plane 204 within each block X to be treated as the potential infected block (element 422) and method 400 returns to element 406. If page Z is the last page within each block X to be considered a potential infected page, the aggressor block iteration variable X is set to zero and the potential infected page variable Z is set to zero (element 424).

Method 400 may continue with determining whether page P is the last page to be considered as the infector page (element 428). If page P is not the last page to be considered as the infector page, the infector page variable Z is adjusted: incremented, wrapped, or the like to identify a next page within plane 204 to be treated as the infector block (element 430) and method 400 returns to element 406. If page P is the last page to be considered as the infector page, method 400 may end at element 432.

Figure 6:
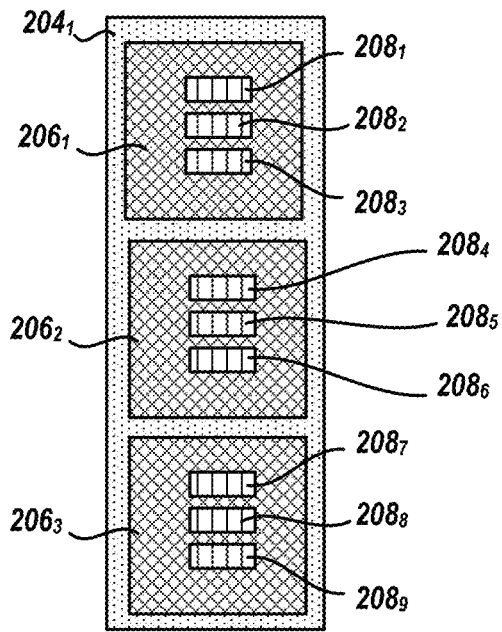
FIG. 6 illustrates an exemplary plane, according to one or more embodiments of the present invention.

FIG. 6 illustrates an exemplary plane $204_1$ within storage device 200. Plane $204_1$ may be one or many planes 204 within storage device 200. Method 400 may be performed in parallel upon multiple planes 204 within storage device 200. Plane $204_1$ includes block $206_1$, block $206_2$, and block $206_3$. Block $206_1$ is assigned as block 0, block $206_2$ is assigned as block 1, and block $206_3$ is assigned as block 2.

Block $206_1$ includes pages $208_1$, $208_2$, and $208_3$. Page $208_1$ is assigned as page 0 within block $206_1$, page $208_2$ is assigned as page 1 within block $206_1$, and $208_3$ is assigned as page 2 within block $206_1$. Block $206_2$ includes pages $208_4$, $208_5$, and $208_6$. Page $208_4$ is assigned as page 0 within block $206_2$, page $208_5$ is assigned as page 1 within block $206_2$, and $208_6$ is assigned as page 2 within block $206_2$. Block $206_3$ includes pages $208_7$, $208_8$, and $208_9$. Page $208_7$ is assigned as page 0 within block $206_3$, page $208_8$ is assigned as page 1 within block $206_3$, and $208_9$ is assigned as page 2 within block $206_3$.

Method 400 may begin by processor(s) 104 programming all the transistors 302 within each storage cell 300 in pages $208_1$, $208_2$, $208_3$, $208_4$, $208_5$, $208_6$, $208_7$, $208_8$, and $208_9$. (element 402).

Method 400 may continue by processor(s) 104 setting infector block iteration variable X equal to zero, infector page variable P equal to zero, and potential infected page variable Z equal to zero. As such, page $208_1$ is set as the acting infector page and block $206_1$ as the acting infector block (i.e. the block 206 that contains the acting infector page). (element 404).

Method 400 may continue with processor(s) 104 reading page $208_1$, $208_4$, and $208_7$. Since a page 208 in each block $206_1$, $206_2$, and $206_3$ is read, all the pages 208 within plane $204_1$ are forced into the Positive state. (element 406).

Method 400 may continue with processor(s) 104 reading the current acting infector page $208_1$ a predetermined number of instances. (element 408) Subsequently, method 400 may continue with processor(s) 104 reading page $208_4$ and page $208_7$ and measuring the RBER of the data read from page $208_4$ and page $208_7$. (element 410).

If the RBER of the data read from page $208_4$ and page $208_7$ is above the RBER threshold, processor(s) 104 indicates that the current acting infector page $208_1$ actually infects such applicable page $208_4$ and/or page $208_7$.

In some embodiments, the possible infected pages 208 within the possible infected blocks, may be in the same relative position, location, or the like, within their associated block 206 relative to the position, location, or the like of the acting infector page within the acting infector block. For example, if page $208_1$ is the acting infector page and is in the first location within the acting infector block $206_1$, the possible infected blocks $208_4$ and $208_7$ may be chosen because of their same relative first location within the respective possible infected blocks $206_2$ and $206_3$ to be tested as the possible infected blocks.

A next iteration may be conducted where page $208_4$ is set as the acting infector page and block $206_2$ as the acting infector block. Method 400 may be repeated from element 406 where page $208_1$ and page $208_7$ are set as potential infected pages to determine and indicate whether page $208_4$ actually infects page $208_1$ and/or page $208_7$. A next iteration may be conducted where page $208_7$ is set as the acting infector page and block $206_3$ as the acting infector block. Method 400 may be repeated from element 406 where page $208_1$ and page $208_4$ are set as potential infected pages to determine and indicate whether page $208_7$ actually infects page $208_1$ and/or page $208_4$.

A next iteration may be conducted where page $208_2$ is set as the acting infector page and block $206_1$ as the acting infector block. Method 400 may be repeated from element 406 where page $208_5$ and page $208_8$ are set as potential infected pages to determine and indicate whether page $208_2$ actually infects page $208_5$ and/or page $208_8$. A next iteration may be conducted where page $208_5$ is set as the acting infector page and block $206_2$ as the acting infector block. Method 400 may be repeated from element 406 where page $208_2$ and page $208_8$ are set as potential infected pages to determine and indicate whether page $208_5$ actually infects page $208_2$ and/or page $208_8$. A next iteration may be conducted where page $208_8$ is set as the acting infector page and block $206_3$ as the acting infector block. Method 400 may be repeated from element 406 where page $208_2$ and page $208_5$ are set as potential infected pages to determine and indicate whether page $208_8$ actually infects page $208_2$ and/or page $208_5$.

A next iteration may be conducted where page $208_3$ is set as the acting infector page and block $206_1$ as the acting infector block. Method 400 may be repeated from element 406 where page $208_6$ and page $208_9$ are set as potential infected pages to determine and indicate whether page $208_3$ actually infects page $208_6$ and/or page $208_9$. A next iteration may be conducted where page $208_6$ is set as the acting infector page and block $206_2$ as the acting infector block. Method 400 may be repeated from element 406 where page $208_3$ and page $208_9$ are set as potential infected pages to determine and indicate whether page $208_6$ actually infects page $208_3$ and/or page $208_9$. A next iteration may be conducted where page $208_9$ is set as the acting infector page and block $206_3$ as the acting infector block. Method 400 may be repeated from element 406 where page $208_3$ and page $208_6$ are set as potential infected pages to determine and indicate whether page $208_9$ actually infects page $208_3$ and/or page $208_6$.

Figure 7:
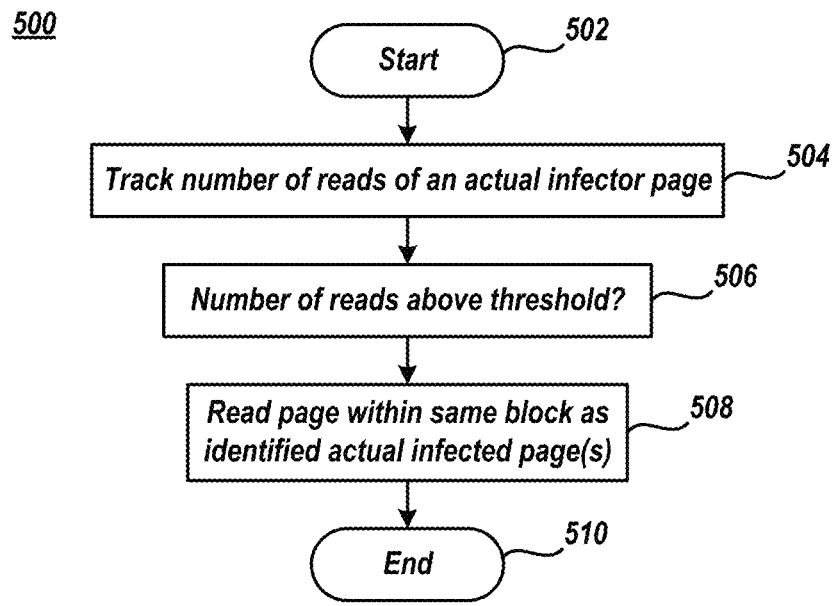
FIG. 7 illustrates an exemplary method for placing infected pages within an infected block in a positive state, according to one or more embodiments of the present invention.

FIG. 7 illustrates an exemplary method 500 for placing infected pages within an infected block in a positive state, according to one or more embodiments of the present invention.

If a page 208 is determined to actually infect a page 208 in another block 206 (i.e. the infected block), such indication may be made by processor(s) 104 within an appropriate data structure stored within memory 106 and/or within storage 108. The data structure may also store a predetermined number of reads of the actual infector page(s) 208 that should trigger a read of a page 208 within the infected block(s) 206 in order to ensure that all of pages 208 in the infected block(s) 206 are in the Positive state. The processor(s) 104 may keep a count of the number of instances of that each actual infector page(s) 208 are read (element 504) and may query the data structure to determine whether the number of reads of the actual infector page(s) 208 exceed the associated predetermined number of reads (element 506). If the actual number of reads exceed the threshold, a read of any page 208 within the identified infected block(s) is triggered to ensure that all of pages 208 therein are in the Positive state (element 508). Method 500 ends at block 510.

Such embodiments described herein may effectively ensure that when any given page 208 is read, the block 206 that which contains that page 208 is already in the Positive state (i.e. all pages 208 in that block 206 are in the Positive state) which results in a high probability of reading accurate data. Because of the increased probability of reading accurate data, such embodiments may also eliminate the latency of a second read of a page 208 when the first read of that page 208 contains errors.

The flowcharts and block diagrams in the Figures illustrate exemplary architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over those found in the marketplace, or to enable others of ordinary skill in the art to understand the embodiments disclosed herein.

What is claimed is:

1. A method for determining a read apparent voltage infector and infected page comprising:
   initially programming each page of each block within a plane such that each transistor within the plane stores a same binary value;
   reading one or more pages within each block within the plane to force, for each transistor within the plane, an apparent threshold voltage to equal an actual threshold voltage;
   setting an acting infector page within an acting infector block within the plane;
   setting a possible infected page within a possible infected block that is different from the acting infector block within the plane;
   reading the acting infector page a predetermined plurality of instances;
   subsequently reading the possible infected page;
   determining a raw bit error rate (RBER) of the read of the possible infected page versus the same binary value initially programmed to the possible infected page; and
   setting the acting infector page as an actual infector page and setting the possible infected page as an actual infected page if the determined RBER is above a predetermined RBER threshold.

2. The method of claim 1, wherein programming each block comprises:
   electrically charging each floating gate of each page.

3. The method of claim 1, further comprising:
   setting the acting infector block as an actual infector block and setting the possible infected block as an actual infected block, if the determined RBER is above the predetermined RBER threshold.

4. The method of claim 3, further comprising:
   determining whether a number of instances the actual infector page is read exceeds a predetermined read threshold; and
   if the number of instances the actual infector page is read exceeds the predetermined read threshold, reading any page within the actual infected block.

5. The method of claim 4, wherein reading any page within the actual infected block comprises:
   for each transistor of each page within the actual infected block, forcing an apparent threshold voltage equal to an actual threshold voltage.

6. The method of claim 1, further comprising:
   indicating the actual infector page infects the actual infected page.

7. The method of claim 1, wherein setting the possible infected page as the actual infected page comprises:
   for one or more transistors of the possibly infected page, determining that an apparent threshold voltage does not equal an actual threshold voltage.

8. A computer program product for determining a read apparent voltage infector and infected page, the computer program product comprising a computer readable storage medium having program instructions embodied therewith, the program instructions readable by a processor to cause the processor to:
   initially program each page of each block within a plane such that each transistor within the plane stores a same binary value;
   read one or more pages within each block within the plane to force, for each transistor within the plane, an apparent threshold voltage to equal an actual threshold voltage;
   set an acting infector page within an acting infector block within the plane;
   set a possible infected page within a possible infected block that is different from the acting infector block within the plane;
   read the acting infector page a predetermined plurality of instances;
   subsequently read the possible infected page;
   determine a raw bit error rate (RBER) of the read of the possible infected page versus the same binary value initially programmed to the possible infected page; and
   set the acting infector page as an actual infector page and setting the possible infected page as an actual infected page if the determined RBER is above a predetermined RBER threshold.

9. The computer program product of claim 8, wherein the program instructions that are readable by the processor to cause the processor to program each block further cause the processor to:
   electrically charge each floating gate of each page.

10. The computer program product of claim 8, wherein the program instructions are readable by the processor to further cause the processor to:
    set the acting infector block as an actual infector block and set the possible infected block as an actual infected block, if the determined RBER is above the predetermined RBER threshold.

11. The computer program product of claim 10, wherein the program instructions are readable by the processor to further cause the processor to:
   determine whether a number of instances the actual infector page is read exceeds a predetermined read threshold; and
   if the number of instances the actual infector page is read exceeds the predetermined read threshold, read any page within the actual infected block.

12. The computer program product of claim 11, wherein the program instructions that are readable by the processor to cause the processor to read any page within the actual infected block further cause the processor to:
   for each transistor of each page within the actual infected block, force an apparent threshold voltage equal to an actual threshold voltage.

13. The computer program product of claim 8, wherein the program instructions are readable by the processor to further cause the processor to:
   indicate the actual infector page infects the actual infected page.

14. The computer program product of claim 8, wherein the program instructions that are readable by the processor to cause the processor to set the possible infected page as the actual infected page further cause the processor to:
   for one or more transistors of the possibly infected page, determine that an apparent threshold voltage does not equal an actual threshold voltage.

15. A computer comprising a processor and a memory, the memory comprising program instructions that are readable by the processor to cause the processor to:
   initially program each page of each block within a plane such that each transistor within the plane stores a same binary value;
   read one or more pages within each block within the plane to force, for each transistor within the plane, an apparent threshold voltage to equal an actual threshold voltage;
   set an acting infector page within an acting infector block within the plane;
   set a possible infected page within a possible infected block that is different from the acting infector block within the plane;
   read the acting infector page a predetermined plurality of instances;
   subsequently read the possible infected page;
   determine a raw bit error rate (RBER) of the read of the possible infected page versus the same binary value initially programmed to the possible infected page; and
   set the acting infector page as an actual infector page and setting the possible infected page as an actual infected page if the determined RBER is above a predetermined RBER threshold.

16. The computer of claim 15, wherein the program instructions that are readable by the processor to cause the processor to program each block further cause the processor to:
   electrically charge each floating gate of each page.

17. The computer of claim 15, wherein the program instructions are readable by the processor to further cause the processor to:
   set the acting infector block as an actual infector block and set the possible infected block as an actual infected block, if the determined RBER is above the predetermined RBER threshold.

18. The computer of claim 17, wherein the program instructions are readable by the processor to further cause the processor to:
   determine whether a number of instances the actual infector page is read exceeds a predetermined read threshold; and
   if the number of instances the actual infector page is read exceeds the predetermined read threshold, read any page within the actual infected block.

19. The computer of claim 18, wherein the program instructions that are readable by the processor to cause the processor to read any page within the actual infected block further cause the processor to:
   for each transistor of each page within the actual infected block, force an apparent threshold voltage equal to an actual threshold voltage.

20. The computer of claim 15, wherein the program instructions are readable by the processor to further cause the processor to:
   indicate the actual infector page infects the actual infected page.

* * * * *